(12) United States Patent
Li et al.

(10) Patent No.: US 9,047,960 B2
(45) Date of Patent: Jun. 2, 2015

(54) FLASH MEMORY CELL WITH CAPACITIVE COUPLING BETWEEN A METAL FLOATING GATE AND A METAL CONTROL GATE

(71) Applicant: QUALCOMM Incorporated, San Diego, CA (US)

(72) Inventors: Xia Li, San Diego, CA (US); Bin Yang, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/957,460

(22) Filed: Aug. 2, 2013

(65) Prior Publication Data

US 2015/0036437 A1    Feb. 5, 2015

(51) Int. Cl.
| | |
|---|---|
| G11C 16/00 | (2006.01) |
| G11C 16/10 | (2006.01) |
| H01L 21/28 | (2006.01) |
| H01L 29/66 | (2006.01) |
| G11C 16/14 | (2006.01) |

(52) U.S. Cl.
CPC .......... *G11C 16/10* (2013.01); *H01L 21/28273* (2013.01); *H01L 29/66825* (2013.01); *G11C 16/14* (2013.01)

(58) Field of Classification Search
CPC .... G11C 16/10; G11C 16/14; G11C 16/0425; H01L 21/28273; H01L 29/66825
USPC ............................. 365/185.33, 185.1, 185.05
See application file for complete search history.

(56) References Cited

U.S. PATENT DOCUMENTS

| | | | | |
|---|---|---|---|---|
| 4,437,172 | A * | 3/1984 | Masuoka | 365/185.14 |
| 5,801,993 | A * | 9/1998 | Choi | 365/185.28 |
| 6,265,266 | B1 | 7/2001 | Dejenfelt et al. | |
| 6,673,678 | B2 | 1/2004 | Furuhata | |
| 6,924,186 | B2 | 8/2005 | Sandhu et al. | |
| 7,289,366 | B2 * | 10/2007 | Lee et al. | 365/185.18 |
| 7,339,824 | B2 * | 3/2008 | Lee et al. | 365/185.11 |
| 7,436,020 | B2 | 10/2008 | Forbes | |
| 7,688,627 | B2 * | 3/2010 | Haggag et al. | 365/185.08 |
| 7,889,553 | B2 * | 2/2011 | Terzioglu et al. | 365/185.1 |
| 2004/0065917 | A1 | 4/2004 | Fan et al. | |
| 2005/0185501 | A1* | 8/2005 | Lee et al. | 365/238.5 |
| 2007/0097745 | A1* | 5/2007 | Benjamin | 365/185.14 |
| 2007/0115728 | A1* | 5/2007 | Lambrache | 365/185.28 |
| 2008/0083942 | A1 | 4/2008 | Terzioglu et al. | |
| 2009/0290417 | A1* | 11/2009 | Park et al. | 365/185.08 |
| 2011/0309426 | A1 | 12/2011 | Purayath et al. | |
| 2011/0309430 | A1 | 12/2011 | Purayath et al. | |
| 2012/0181595 | A1 | 7/2012 | Huang | |
| 2012/0243337 | A1 | 9/2012 | Lee et al. | |

OTHER PUBLICATIONS

International Search Report and Written Opinion for International Application No. PCT/US2014/047446, ISA/EPO, Date of Mailing Dec. 19, 2014, 11 pages.

* cited by examiner

*Primary Examiner* — Tan T. Nguyen
(74) *Attorney, Agent, or Firm* — Toler Law Group, PC

(57) ABSTRACT

An apparatus includes a storage transistor. The storage transistor includes a floating gate configured to store electrical charge and a control gate. The floating gate is coupled to the control gate via capacitive coupling. The floating gate and the control gate are metal. The apparatus also includes an access transistor coupled to the storage transistor. A gate of the access transistor is coupled to a word line. The storage transistor and the access transistor are serially coupled between a bit line and a source line.

34 Claims, 14 Drawing Sheets

FLASH MEMORY CELL WITH CAPACITIVE COUPLING BETWEEN A METAL FLOATING GATE AND A METAL CONTROL GATE

I. FIELD

The present disclosure is generally related to logic process type flash memory.

II. DESCRIPTION OF RELATED ART

Advances in technology have resulted in smaller and more powerful computing devices. For example, there currently exist a variety of portable personal computing devices, including wireless computing devices, such as portable wireless telephones, tablet computers, and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Electronic devices (e.g., cell phones, laptop computers, tablet computers, etc.) may use flash memory to store data. Flash memory is a type of non-volatile memory that retains stored data even when no power is applied to the memory. A flash memory cell is typically manufactured using a process that involves multiple polysilicon layers. For example, a floating gate of a flash memory cell may be manufactured as a first polysilicon layer and a control gate of the flash memory cell may be manufactured as a second polysilicon layer. The floating gate may be coupled to the control gate using a gate oxide that provides diode coupling.

An electronic device (e.g., a cell phone, a laptop computer, etc.) may store data using external flash memory chips. As process advances enable flash memory cells to be fabricated with smaller dimensions, reduced power usage and increased storage density enhance a user experience with such electronic devices. A flash memory cell may be scaled down to reduce power usage and increase storage density. However, for performance and security reasons, integrated flash cells with logic process (e.g., embedded flash (eflash)) may be needed. Implementing eflash memory cells may add cost to a logic chip due to the use of additional masks (4~12 masks) and process, scaling of a eflash memory cell may be difficult due to flash memory cell physical limitations and logic process constraints. Logic based eflash multi-time programmable (MTP) device may have no process cost adder but may be limited by logic process. For example, scaling of a logic based (e.g., implemented using logic gates) low density eflash memory cell that involves a single polysilicon layer and gate oxide thickness with limited charge loss due to data retention and without increased cost becomes more challenging as the logic based eflash memory cell moves below 65 nanometer (nm) technology. For example, a logic based eflash memory cell having a single polysilicon layer and thinner gate oxide that is manufactured using a 45 nm process may not reliably store electrical charge. The logic based eflash memory cell may have inadequate program and erase performance due to gate oxide capacitive diode coupling between the floating gate and the coupling gate. The diode coupling limits bias type for program and erase and causes additional charge loss.

III. SUMMARY

Systems and methods of manufacturing a logic based flash memory cell (e.g., an embedded electrical erasable flash memory cell) without adding extra masks and process steps are disclosed. The described techniques may enable a logic based flash memory cell (e.g., the flash memory cell is implemented using logic gates) to be manufactured by using a high-k/metal gate manufacturing process (e.g., in a sub-28 nm manufacturing process) to enhance capacitive coupling between a floating gate and a control gate of a logic based flash memory cell. The use of high-k/metal gate with a high resistance metal plate manufacturing process enables tuning of the capacitive coupling between the floating gate and the metal control gate; thus, a programming voltage of the logic based flash memory cell may be reduced as compared to the use of a gate oxide diode coupling device. Improving coupling efficiency and reducing programming voltage may reduce design complexity and power consumption of a logic based flash memory cell.

For example, a flash memory cell (e.g., a logic based eflash memory cell) may include a floating gate and a control gate. The floating gate and the control gate may be coupled via a capacitive coupling layer. The capacitive coupling layer may be formed using material with a high dielectric constant ("high-k"), such as silicon carbide, silicon nitride, etc. In a particular embodiment, the memory cell includes an erase gate that is coupled to the floating gate via a spacer layer. The floating gate and the control gate, and erase gate through the spacer layer may be formed by metal gate film deposits.

The flash MTP memory cell may be implemented as a flash memory cell circuit. In a particular embodiment, the flash memory cell circuit is implemented using p-type transistors. The flash memory cell circuit may include a storage transistor and an access transistor. The storage transistor may be serially coupled to the access transistor. A gate of the storage transistor may be coupled to a first plate of a plate capacitor. The first plate may correspond to the floating gate and a second plate of the plate capacitor may correspond to the control gate. The use of the plate capacitor may simplify design complexity of the memory cell as the plate capacitor may be biased to either a positive voltage or to a negative voltage instead of limiting a bias voltage to only a positive voltage or only a negative voltage. When combined with a substrate well and source line or bit line voltage, the use of the plate capacitor may reduce voltage of control gate, source line voltage or bit line voltage while keeping a program voltage or an erase voltage sufficient for a program operation and/or an erase operation.

In a particular embodiment, an apparatus includes a storage transistor, where the storage transistor includes a floating gate configured to store electrical charge and a control gate. The floating gate is coupled to the control gate via capacitive coupling. The floating gate and the control gate are metal. The apparatus also includes an access transistor coupled to the storage transistor, where a gate of the access transistor is coupled to a word line, and where the storage transistor and the access transistor are serially coupled between a bit line and a source line.

In another particular embodiment, a method includes depositing a gate dielectric layer on a surface of a substrate. The method also includes depositing a first metal film on a surface of the gate dielectric layer to form a floating gate of a storage transistor and a gate of an access transistor. The method further includes depositing a capacitive film layer on a surface of the floating gate. The method further includes depositing a second metal film on a surface of the capacitive film layer to form a control gate, where the storage transistor and the access transistor are serially coupled between a bit line and a source line.

One particular advantage provided by at least one of the disclosed embodiments is an ability to manufacture a logic based flash memory cell using a high-k/metal gate manufacturing process. The use of a high-k/metal gate manufacturing process enables tuning of capacitive coupling between a floating gate and a metal control gate of the logic based flash memory cell; thus, a programming voltage of the logic based flash memory cell may be reduced as compared to the use of a gate oxide diode coupling between the floating gate and the control gate. Improving coupling efficiency and reducing programming voltage may reduce design complexity and power consumption of a logic based flash memory cell. Other aspects, advantages, and features of the present disclosure will become apparent after review of the entire application, including the following sections: Brief Description of the Drawings. Detailed Description, and the Claims.

IV. BRIEF DESCRIPTION OF THE DRAWINGS

IV. DETAILED DESCRIPTION

Figure 1:
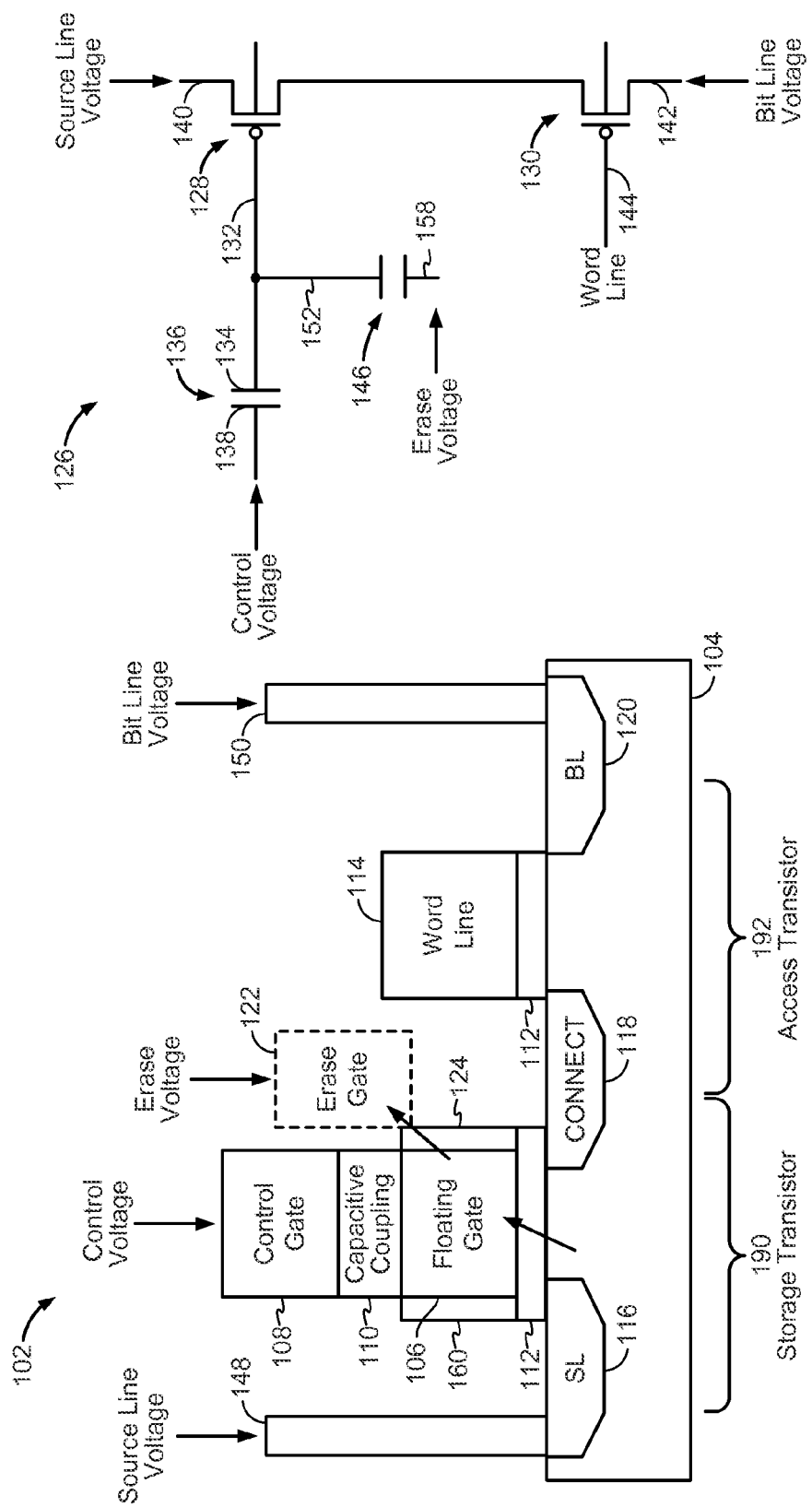
FIG. 1 is a diagram of a particular embodiment of a flash memory cell that is manufactured using a high-k/metal gate manufacturing process.

FIG. 1 illustrates a particular embodiment of a flash memory cell that is manufactured using a high-k/metal gate manufacturing process. A flash memory cell 102 may include a storage transistor 190 and an access transistor 192 formed on a substrate 104. In a particular embodiment, the flash memory cell 102 is an embedded electrical erasable flash (eflash) memory cell. In another particular embodiment, the flash memory cell 102 is a logic based eflash memory cell (e.g., the flash memory cell 102 is implemented using logic gates). The storage transistor 190 may include a floating gate 106 and a control gate 108. The floating gate 106 and the control gate 108 may be coupled via a capacitive coupling layer 110. The control gate 108 may be configured to vary electrical charge stored in the floating gate 106 by applying a bias voltage to the control gate 108 to control charge injection or tunneling into or out of the floating gate 106. The capacitive coupling layer 110 may be formed using material with a high dielectric constant ("high-k"), such as silicon carbide, silicon nitride, etc. During manufacturing, the capacitive coupling layer 110 may be tuned (e.g., a thickness of the capacitive coupling layer 110 may be tuned) to reduce a programming voltage of the flash memory cell 102, as compared to the use of a gate oxide diode coupling device, to perform capacitive coupling of the floating gate 106 and the control gate 108.

The floating gate 106 may be located on a high-k dielectric layer 112 that is formed on a surface of the substrate 104. The floating gate 106 may be adjacent to spacer layers 124 and 160. A word line 114 may also be located on the high-k dielectric layer 112 and may function as the gate of the access transistor 192. A source line region 116, a connection region 118, and a bit line region 120 may be highly doped regions in the substrate 104. The source line region 116 may be coupled to a source line 148, and the bit line region 120 may be coupled to a bit line 150. In a particular embodiment, the flash memory cell 102 includes an erase gate 122 that is coupled to the floating gate 106 via the spacer layer 124. The erase gate 122 may be configured to provide an erase current path to reduce an amount of electrical charge stored in the floating gate 106 (e.g., the electrical charge may be discharged via the erase gate 122 to erase data stored at the flash memory cell 102 by a Fowler-Nordheim (F-N) tunneling). The control gate 108 may be formed via metal film deposits and patterning.

The flash memory cell 102 may be configured to store data as electrical charge in the floating gate 106. During a programming operation, a particular amount of electrical charge may be stored in the flash memory cell 102. For example, a source line voltage may bias the source line region 116 and a control voltage may bias the control gate 108 so that there is a first positive voltage potential (e.g., 4 volts) from the control gate 108 to the source line region 116. As a result of the first positive voltage potential, charge carriers (e.g., electrons) may move through the high-k dielectric layer 112 and into the floating gate 106 (as illustrated by an arrow in FIG. 1) via a channel hot electron (CHE) injection process. The resulting electrical charge may be held at the floating gate 106 due to insulation by the spacer layers 124, 160 and the capacitive coupling layer 110.

During an erase operation, electrical charge stored in the floating gate 106 may be removed. For example, the control voltage may bias the control gate 108 and an erase voltage may bias the erase gate 122 so that there is a second positive voltage potential from the erase gate 122 to the control gate 108. As a result of the second positive voltage potential, electrical charge stored in the floating gate 106 moves through the spacer layer 124 and into the erase gate 122 (as illustrated by an arrow in FIG. 1) via a Fowler-Nordheim (F-N) tunneling process.

During a read operation, an amount of electrical charge stored in the floating gate 106 may be measured. The amount of electrical charge stored in the floating gate 106 may correspond to a threshold voltage value that represents a logic value (e.g., a logic value 1 or a logic value 0). For example, the source line region 116, the control gate 108, and the bit line region 120 may be biased by the source line voltage via the source line 148, by the control voltage, and by the bit line voltage via the bit line 150, respectively. A first current path may be formed between the source line region 116 and the connection region 118. The word line 114 may be biased by applying a voltage (e.g., a word line voltage) to the word line 114 so that a second current path is formed between the connection region 118 and the bit line region 120. The word line 114 may be biased such that the second current path includes an inversion layer to enable conduction between the connection region 118 and the bit line region 120.

Current (e.g., read current) may be generated due to the voltage difference between the source line voltage and the bit line voltage. The read current from the bit line 150 to the source line 148 may be enabled by the word line voltage. A magnitude of the read current controlled by a floating gate threshold voltage may be proportional to the electrical charge stored in the floating gate 106. A sense amplifier may measure the read current to determine a logic value stored in the flash memory cell 102.

The flash memory cell 102 may be implemented using p-type transistors. For example, a flash memory cell circuit 126 corresponds to the flash memory cell 102. The flash memory cell circuit 126 may include a storage transistor 128 and an access transistor 130. The storage transistor 128 may be serially coupled to the access transistor 130. A gate 132 of the storage transistor 128 may be coupled to a first plate 134 of a plate capacitor 136. The first plate 134 may correspond to the floating gate 106 and a second plate 138 of the plate capacitor 136 may correspond to the control gate 108. The use of the plate capacitor 136 may simplify design complexity of the flash memory cell 102 as the plate capacitor 136 may be biased to either a positive voltage or to a negative voltage. In contrast to the flash memory cell 102, a conventional poly-gate flash memory cell may implement a coupling mechanism between a floating gate of the poly-gate flash memory cell and a control gate of the poly-gate flash memory using a p-type transistor that does not support operation at negative bias.

A source 140 of the storage transistor 128 may correspond to the source line region 116 and a drain 142 of the access transistor 130 may correspond to the bit line region 120. A gate 144 of the access transistor 130 may correspond to the word line 114. As an option, a plate 152 of an erase capacitor 146 may be coupled to the gate 132 of the storage transistor 128. An erase gate plate 158 of the erase capacitor 146 may correspond to the erase gate 122. The spacer layer 124 may correspond to an erase capacitor insulator.

Although the flash memory cell circuit 126 is implemented using p-type transistors in FIG. 1, it should be understood that in other implementations the flash memory cell circuit 126 may be implemented using n-type transistors. In a particular embodiment, the floating gate 106 is an n-type metal gate and the storage transistor 128 is a p-type transistor with an n-type metal gate. In another particular embodiment, the floating gate 106 is a p-type metal gate and the storage transistor 128 is a p-type transistor with a p-type metal gate. In another particular embodiment, the floating gate 106 is an n-type metal gate and the storage transistor 128 is an n-type transistor with an n-type metal gate. In another particular embodiment, the floating gate 106 is a p-type metal gate and the storage transistor 128 is an n-type transistor with a p-type metal gate.

Thus, the flash memory cell 102 may be manufactured using a high-k/metal gate with high resistance metal plate manufacturing process to enable tuning of the capacitive coupling between the floating gate 106 and the control gate 108; thus, a programming voltage of the flash memory cell 102 may be reduced as compared to the use of a gate oxide diode coupling device.

Figure 2:
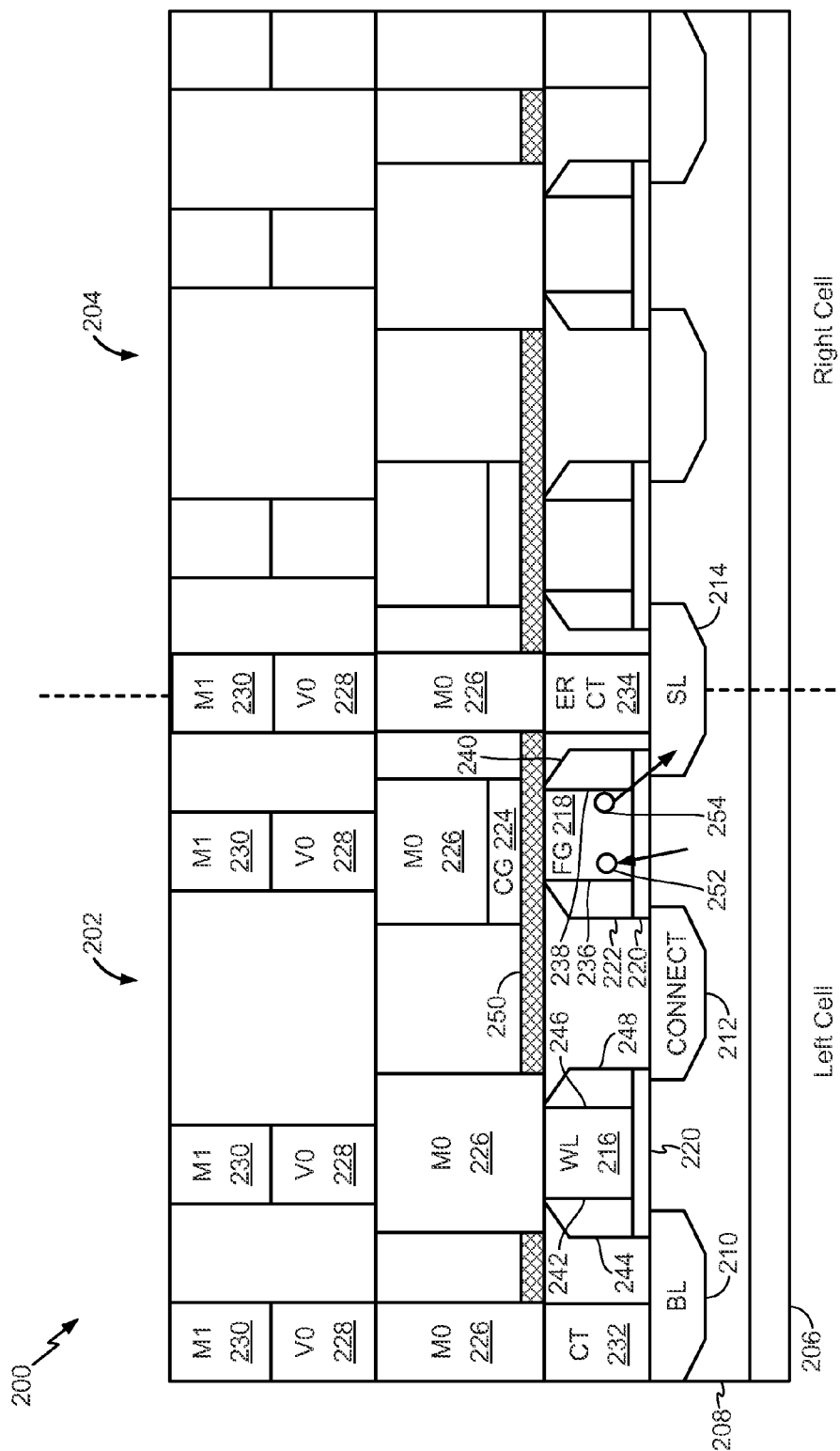
FIG. 2 is a cross section view of a particular embodiment of a flash memory cell array that includes a flash memory cell manufactured using a high-k/metal gate manufacturing process.
Figure 3:
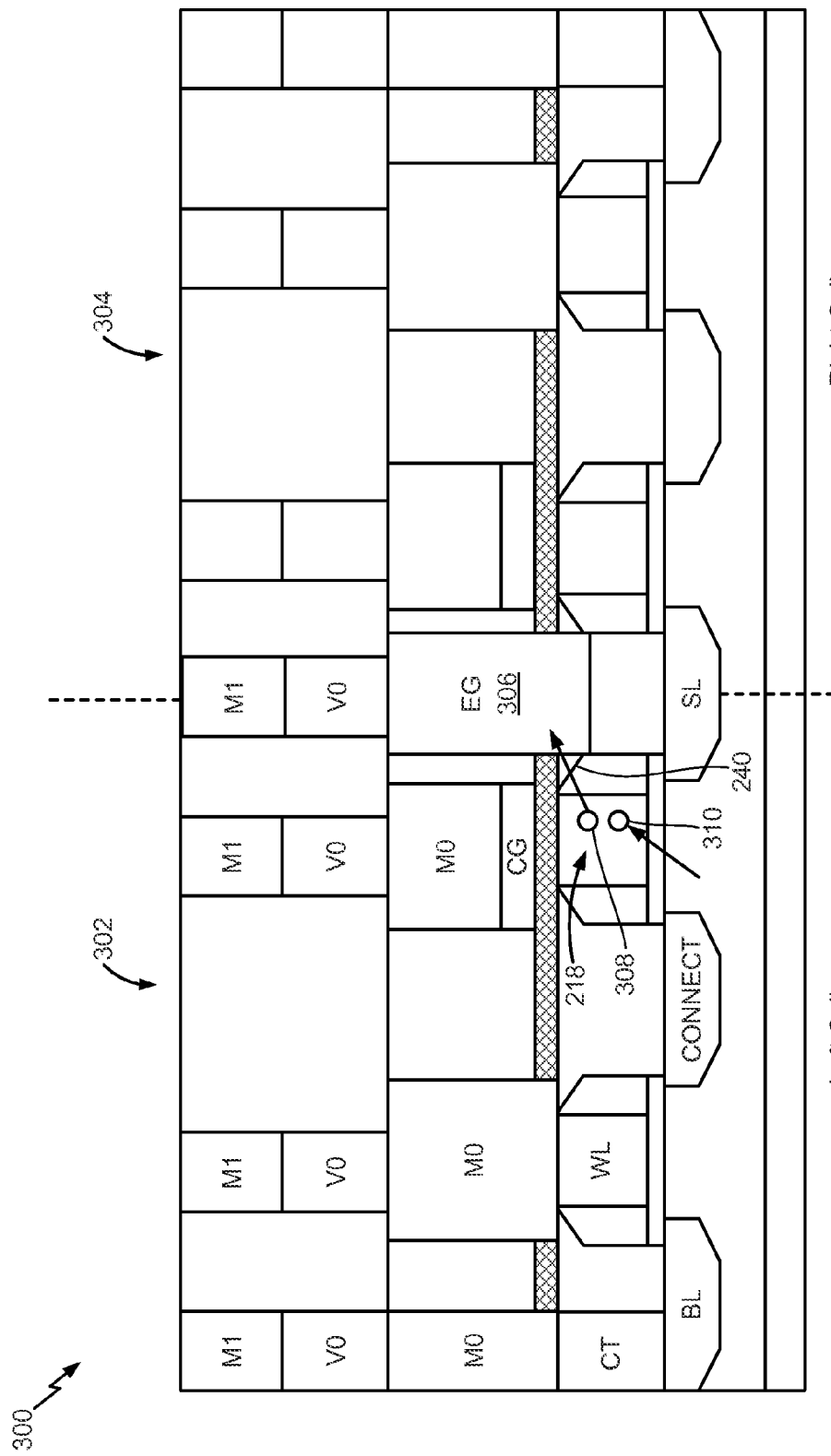
FIG. 3 is a cross section view of another particular embodiment of a flash memory cell array that includes a flash memory cell manufactured using a high-k/metal gate manufacturing process.
Figure 4:
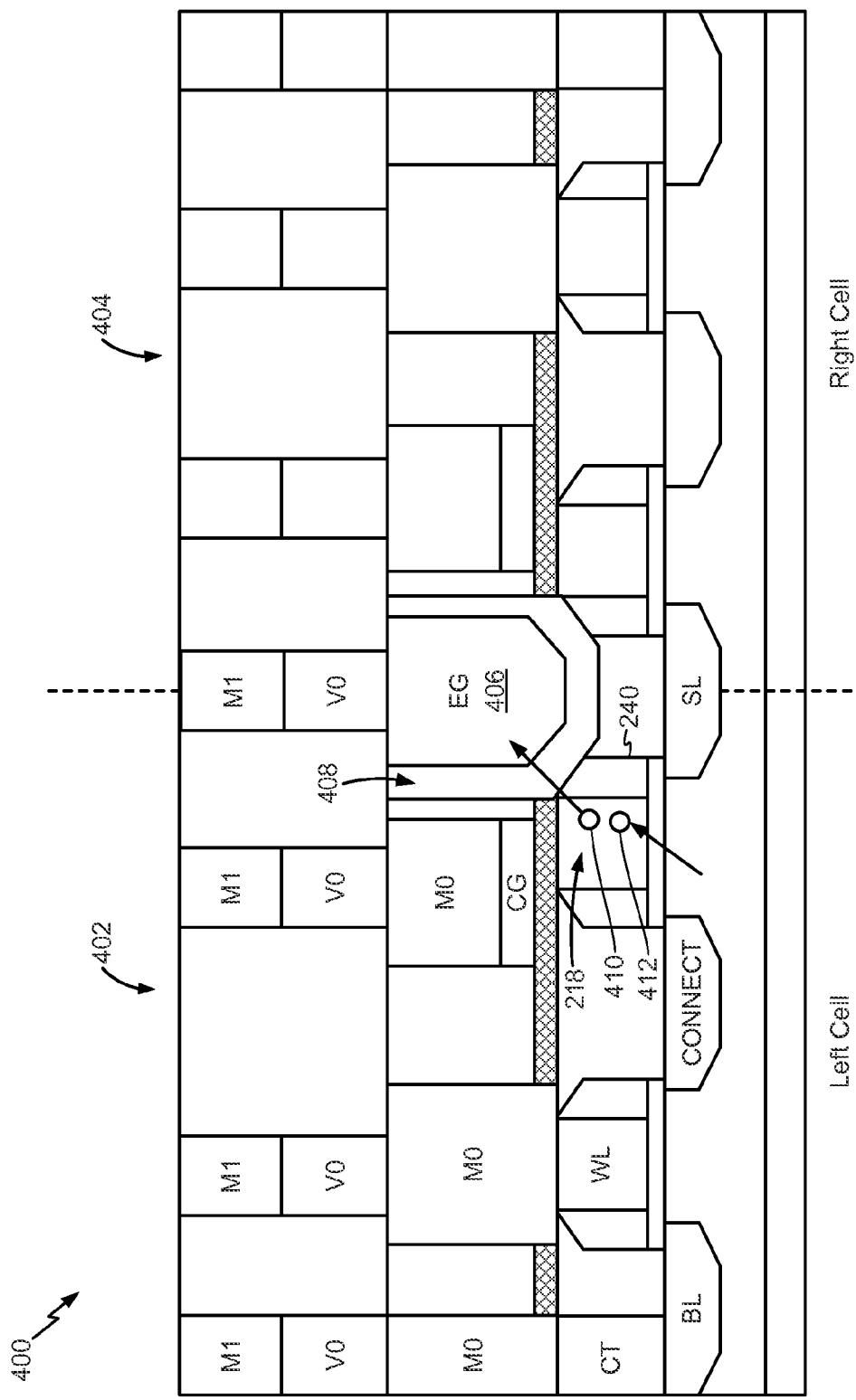
FIG. 4 is a cross section view of another particular embodiment of a flash memory cell array that includes a flash memory cell manufactured using a high-k/metal gate manufacturing process.
Figure 5:
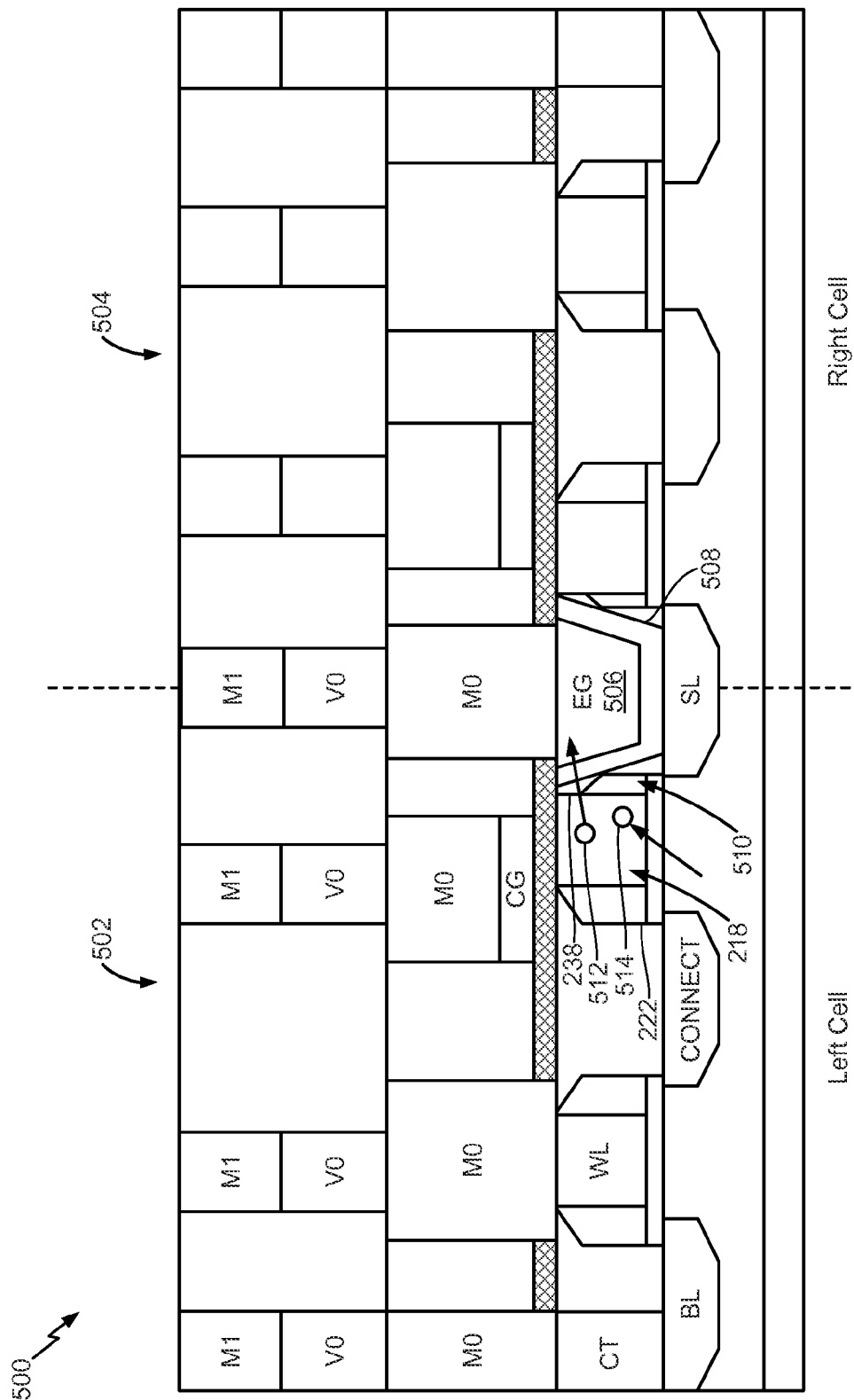
FIG. 5 is a cross section view of another particular embodiment of a flash memory cell array that includes a flash memory cell manufactured using a high-k/metal gate manufacturing process.
Figure 6:
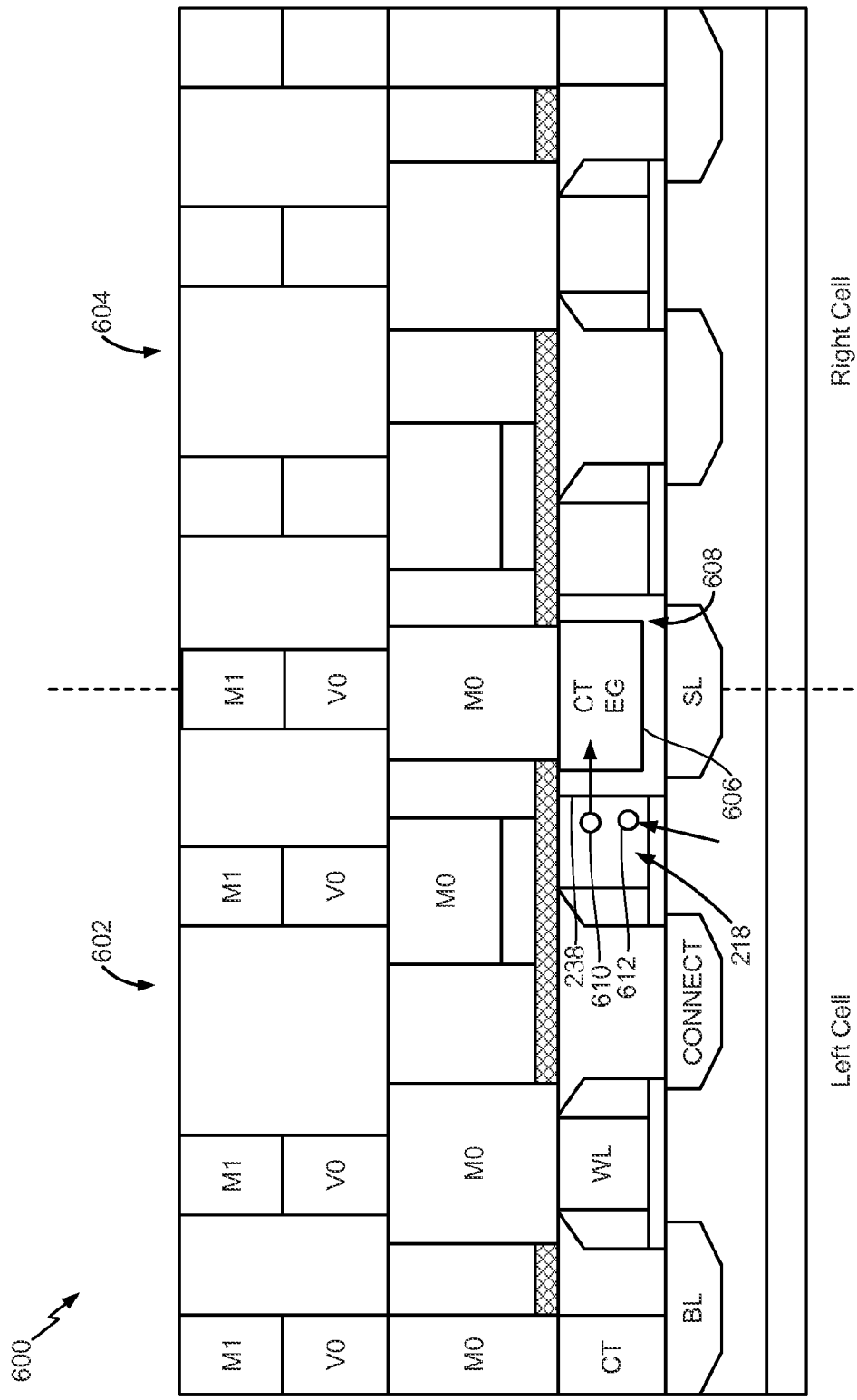
FIG. 6 is a cross section view of another particular embodiment of a flash memory cell array that includes a flash memory cell manufactured using a high-k/metal gate manufacturing process.

FIGS. 2-6 illustrate alternative embodiments of a flash memory cell array that includes a flash memory cell manufactured using a high-k/metal gate manufacturing process for different schemes. In particular, FIG. 2 illustrates a flash memory cell array that includes a flash memory cell having an erase contact terminal. FIG. 3 illustrates a flash memory cell array that includes a flash memory cell having an erase gate that is coupled to a floating gate via a spacer layer. FIG. 4 illustrates a flash memory cell array that includes a flash memory cell having an erase gate that is coupled to a floating gate via a spacer layer and an oxide layer. FIG. 5 illustrates a flash memory cell array that includes a flash memory cell having an erase gate that is coupled to a floating gate that has a partially exposed side wall. FIG. 6 illustrates a flash memory cell array that includes a flash memory cell having an erase gate that is coupled to a floating gate via an oxide layer.

FIG. 2 illustrates a cross section view of a particular embodiment of a portion of a flash memory cell array 200 that includes two flash memory cells 202 and 204. The flash memory cells 202 and 204 may be substantially similar in structure. The flash memory cell 202 or 204 may correspond to the flash memory cell 102 of FIG. 1. The flash memory cell array 200 may be manufactured using a high-k/metal gate manufacturing process. Embodiments of methods of manufacturing the flash memory cell array 200 are described in more detail with reference to FIGS. 7-11.

A substrate 206 may include a well region 208. The well region 208 may be doped using different type of dopants than the substrate 206 when the flash memory cell 202 is implemented using p-type transistors. For example, the substrate 206 may be doped using p-type dopants and the well region 208 may be doped using n-type dopants. The well region 208 may be doped using the p-type dopants when the substrate 206 has deep nwell dopant (not shown) when the flash memory cell 202 is implemented using n-type transistors.

A bit line region 210, a connection region 212 and a source line region 214 of the flash memory cell 202 may be formed in the well region 208. The bit line region 210, the connection region 212, and the source line region 214 may be doped with dopants having different polarity than the dopants of the well region 208. For example, the bit line region 210, the connection region 212, and the source line region 214 may be doped with p-type dopants and the well region 208 may be doped with n-type dopants.

A word line 216 and a floating gate 218 may be serially coupled between the bit line region 210 and the source line region 214. For example, the word line 216 may be coupled to the bit line region 210 and to the connection region 212 via a gate dielectric layer 220. The floating gate 218 may be coupled to the connection region 212 and to the source line region 214 via the gate dielectric layer 220. Side walls of the word line 216 and side walls of the floating gate 218 may be adjacent to spacer layers. For example, side walls 236 and 238 of the floating gate 218 may be surrounded by spacer layers 222 and 240, respectively. As another example, side walls 242 and 246 of the word line 216 may be adjacent to spacer layers 244 and 248, respectively. A control gate 224 may be coupled to the floating gate 218 via a capacitive film layer 250.

The flash memory cell 202 may include additional layers, such as a first metal layer (M0) 226, a via layer (V0) 228, and a second metal layer (M1) 230, to provide conducting paths to the bit line region 210, to the word line 216, to the control gate 224, and to the source line region 214. The bit line region 210 may be coupled to the first metal layer 226 via a bit line terminal 232. The bit line terminal 232 may be implemented as a contact (CT) terminal of the flash memory cell 202. The source line region 214 may be coupled to the first metal layer 226 via an erase contact terminal 234. The erase contact terminal 234 may provide a conductive path to the source line region 214 and may also serve as a discharge path to an erase path. The flash memory cells 202, 204 may share the source line region 214, the erase contact terminal 234, and the voltage path of the source line region 214.

During a programming operation, electrical charge may flow from the well region 208 toward the floating gate 218 via hot carrier injection and may attain sufficient energy to travel through the gate dielectric layer 220 and into a first region 252 of the floating gate 218 (as shown by an arrow in FIG. 2 near the connection region 212). During an erase operation, electrical charge stored in the floating gate 218 may discharge to the erase contact via a second region 254 of the floating gate 218 (as shown by an arrow of FIG. 2 near the source line region 214) by F-N tunneling. Charging and discharging the floating gate 218 using different regions of the floating gate 218 may reduce stressing the gate dielectric layer 220 as compared to charging and discharging the floating gate 218 using the same region of the floating gate 218, thus prolonging operational life of the flash memory cell 202.

In a particular embodiment, the word line 216 is a p-type metal (e.g., a metal that has a work function similar to a work function of a p-type doped semiconductor) and the floating gate 218 is an n-type metal (e.g., a metal that has a work function similar to a work function of an n-type doped semiconductor) when the flash memory cell 202 is implemented using p-type transistors. In another particular embodiment, the word line 216 is an n-type metal and the floating gate 218 is a p-type metal when the flash memory cell 202 is implemented using n-type transistors.

FIG. 3 illustrates a cross section view of another particular embodiment of a flash memory cell array 300. The flash memory cell array 300 may include two flash memory cells 302 and 304. The flash memory cells 302 and 304 may be similar to the flash memory cells 202 and 204 of FIG. 2. However, instead of the erase contact terminal 234 of FIG. 2, the flash memory cell 302 may include a metal erase gate 306 that is coupled to the floating gate 218 via the spacer layer 240.

The floating gate 218 may receive and discharge electrical charges using different regions of the floating gate 218. For example, during an erase operation, the floating gate 218 may discharge (as shown by an arrow pointing away from the floating gate 218 in FIG. 3) through the spacer layer 240 and into the metal erase gate 306 via a third region 308 of the floating gate 218 by F-N tunneling. The floating gate 218 may receive electrical charge (as shown by an arrow pointing towards the floating gate 218 in FIG. 3) via a region 310 of the floating gate 218 that is different from the third region 308 during a programming operation.

FIG. 4 illustrates a cross section view of another particular embodiment of a flash memory cell array 400. The flash memory cell array 400 may include two flash memory cells 402 and 404. The flash memory cells 402 and 404 may be similar to the flash memory cells 202 and 204 of FIG. 2. However, instead of the erase contact terminal 234 of FIG. 2, the flash memory cell 402 may include a metal erase gate 406. The flash memory cell 402 may also include an oxide layer 408 adjacent to the metal erase gate 406 and to the spacer layer 240.

During an erase operation, the floating gate 218 may discharge (as shown by an arrow pointing away from the floating gate 218 in FIG. 4) stored electrical charge through the spacer layer 240 and the oxide layer 408 into the metal erase gate 406 via a fourth region 410 of the floating gate 218 by F-N tunneling. The floating gate 218 may receive electrical charge (as shown by an arrow pointing towards the floating gate 218 in FIG. 4) via a region 412 of the floating gate 218 that is different from the fourth region 410 during a programming operation.

FIG. 5 illustrates a cross section view of another particular embodiment of a flash memory cell array 500. The flash memory cell array 500 may include two flash memory cells 502 and 504. The flash memory cells 502 and 504 may be similar to the flash memory cells 202 and 204 of FIG. 2. The flash memory cell 502 may include a metal erase gate 506 and an oxide layer 508 that is adjacent to the metal erase gate 506 and to a spacer layer 510. The spacer layer 510 may be adjacent to the side wall 238 of the floating gate 218. The spacer layer 510 may be formed by etching the spacer layer 240 of FIG. 2 such that a portion (e.g., a corner) of the side wall 238 is exposed.

During an erase operation, the floating gate 218 may discharge (as shown by an arrow pointing away from the floating gate 218 in FIG. 5) via a fifth region 512 of the floating gate 218 through the exposed portion of the side wall 238 and through the oxide layer 508 and into the metal erase gate 506 by F-N tunneling. The floating gate 218 may receive electrical charge (as shown by an arrow pointing towards the floating gate 218 in FIG. 5) via a region 514 of the floating gate 218 that is different from the fifth region 512 during a programming operation.

FIG. 6 illustrates a cross section view of another particular embodiment of a flash memory cell array 600. The flash memory cell array 600 may include two flash memory cells 602 and 604. The flash memory cells 602 and 604 may be similar to the flash memory cells 202 and 204 of FIG. 2. The flash memory cell 602 may include a metal erase gate 606 and an oxide layer 608 that is adjacent to the metal erase gate 606. Instead of being adjacent to the spacer layer 240 of FIG. 2, the side wall 238 of the floating gate 218 may be adjacent to the oxide layer 608.

During an erase operation, the floating gate 218 may discharge stored electrical charge (as shown by an arrow pointing away from the floating gate 218 in FIG. 6) through the oxide layer 608 and into the metal erase gate 606 via a sixth region 610 of the floating gate 218 by F-N tunneling. The floating gate 218 may receive electrical charge (as shown by an arrow pointing towards the floating gate 218 in FIG. 6) via a region 612 of the floating gate 218 that is different from the sixth region 610 during a programming operation.

Figure 7:
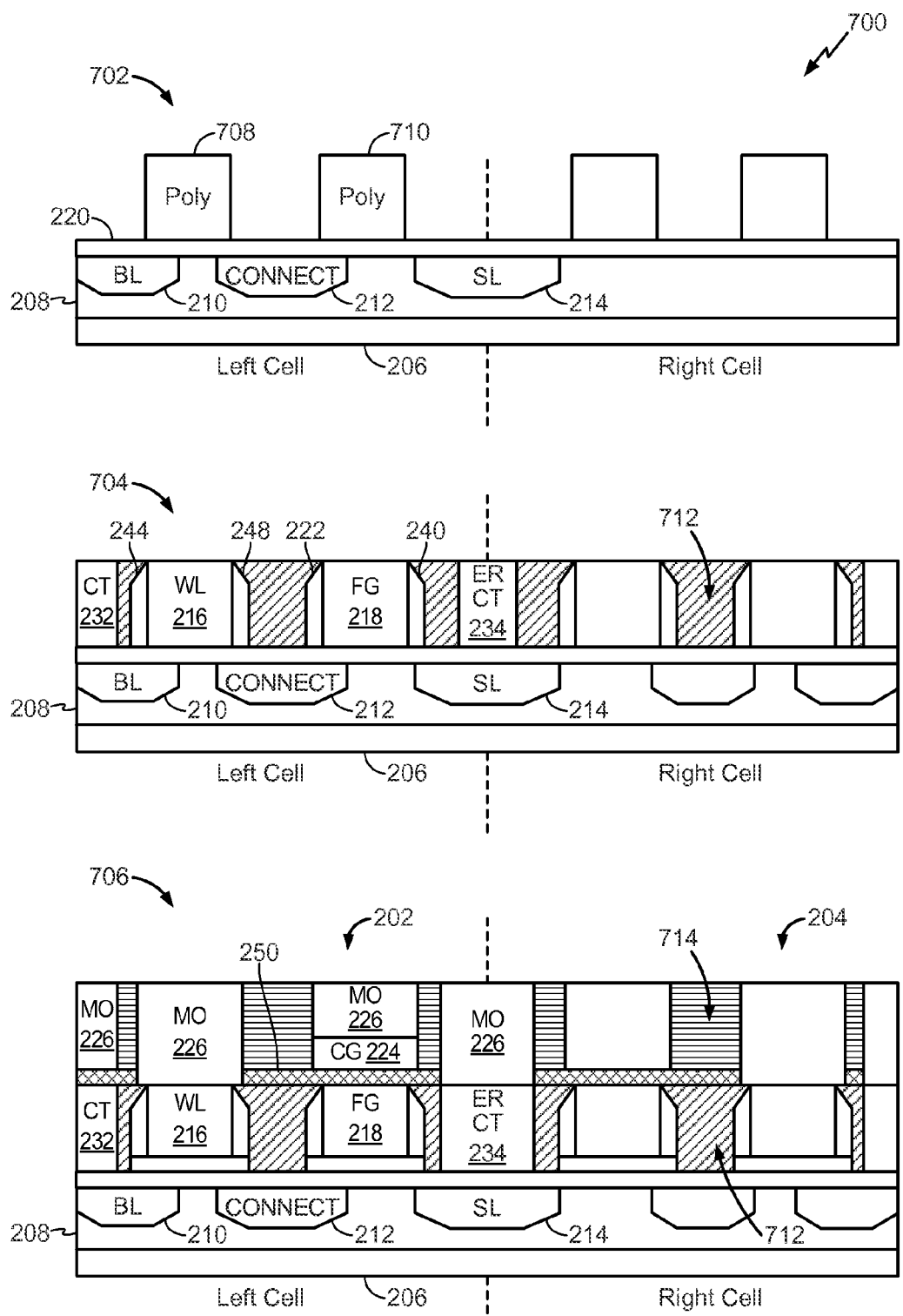
FIG. 7 is a diagram that illustrates a particular embodiment of stages of a high-k/metal gate manufacturing process to manufacture the flash memory cell of FIG. 2.
Figure 8:
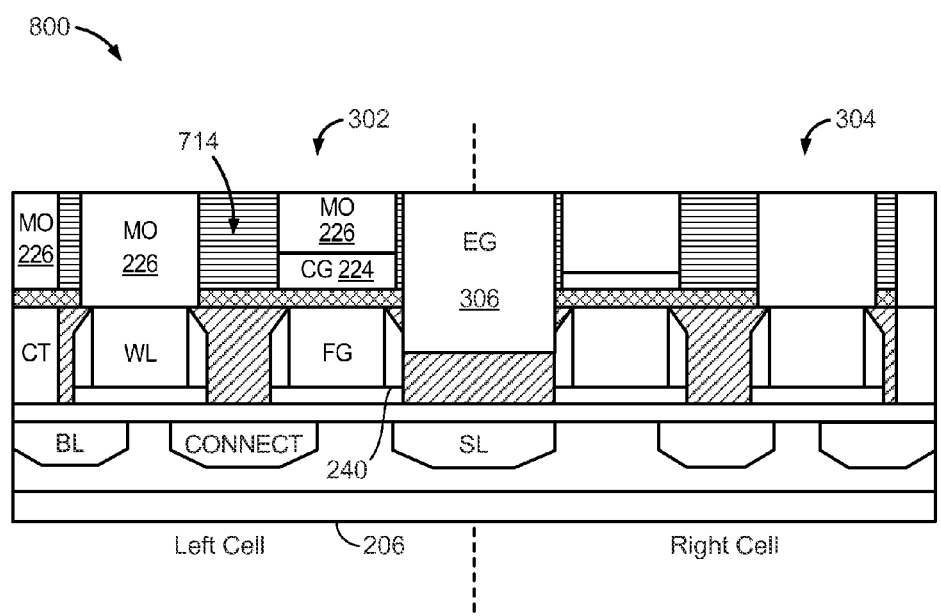
FIG. 8 is a diagram that illustrates another particular embodiment of a stage of a high-k/metal gate manufacturing process to manufacture the flash memory cell of FIG. 3.
Figure 9:
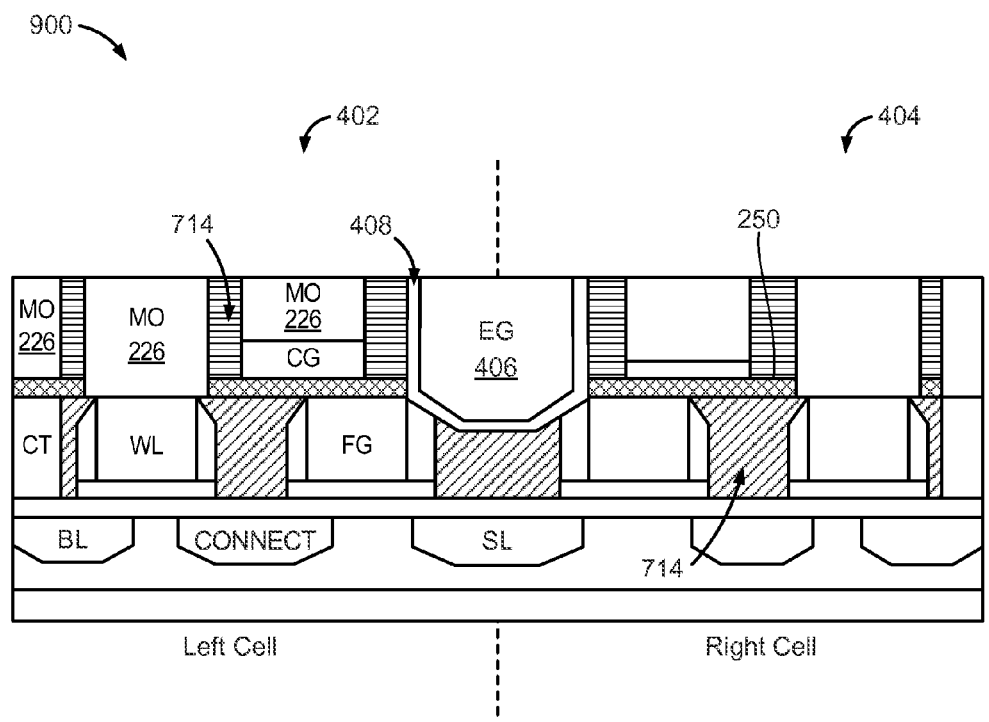
FIG. 9 is a diagram that illustrates another particular embodiment of a stage of a high-k/metal gate manufacturing process to manufacture the flash memory cell of FIG. 4.
Figure 10:
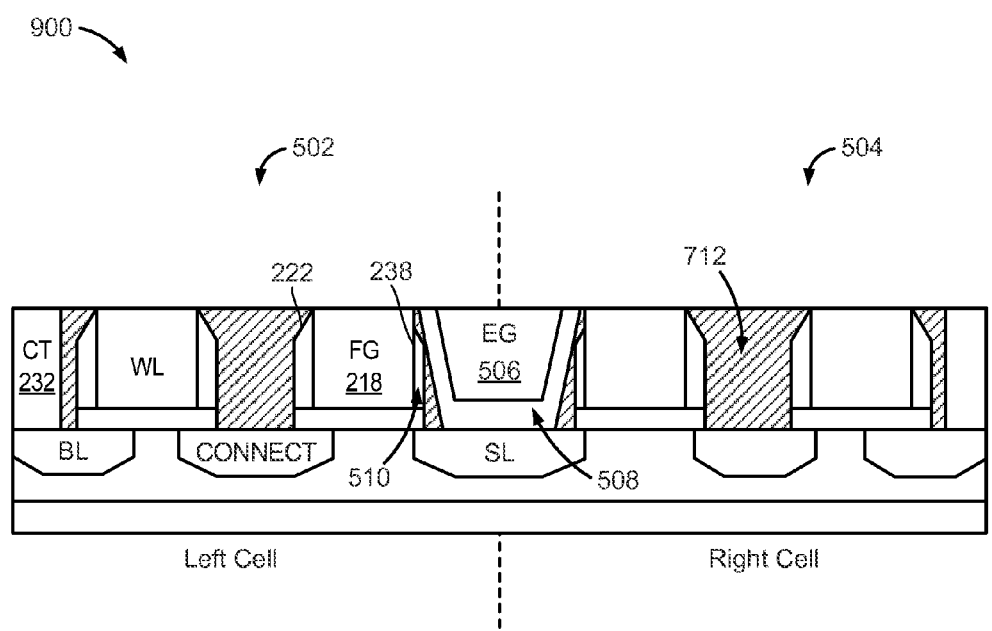
FIG. 10 is a diagram that illustrates another particular embodiment of a stage of a high-k/metal gate manufacturing process to manufacture the flash memory cell of FIG. 5.
Figure 11:
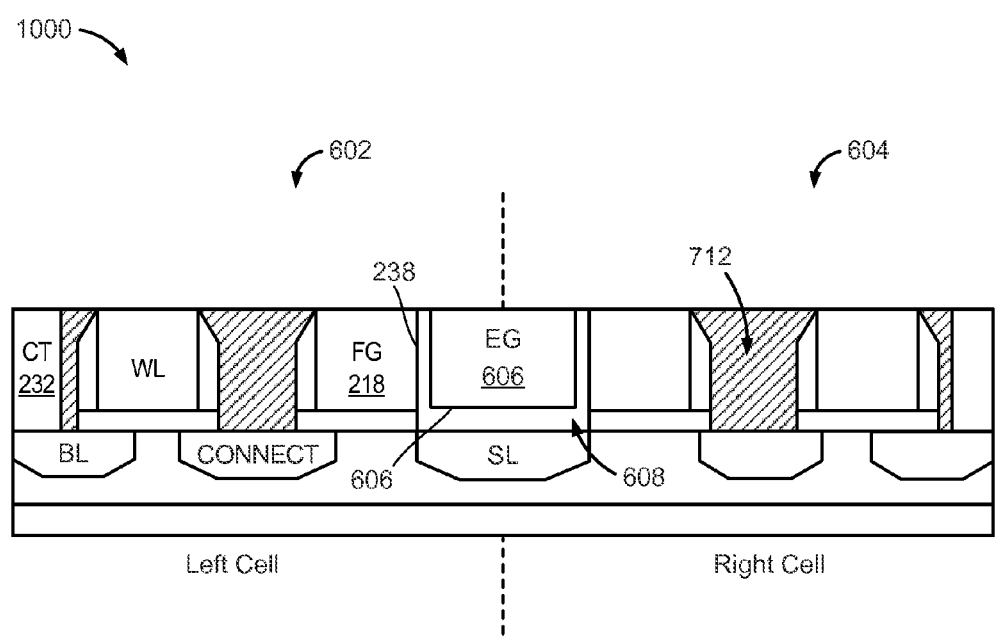
FIG. 11 is a diagram that illustrates another particular embodiment of a stage of a high-k/metal gate manufacturing process to manufacture the flash memory cell of FIG. 6.

FIGS. 7-11 illustrate alternative embodiments of stages of a high-k/metal gate manufacturing process to manufacture a flash memory cell. In particular, FIG. 7 illustrates stages of a high-k/metal gate manufacturing process to manufacture the flash memory cell 202 and/or the flash memory cell 204 of FIG. 2. FIG. 8 illustrates a stage of a high-k/metal gate manufacturing process to manufacture the flash memory cell 302 and/or the flash memory cell 304 of FIG. 3. FIG. 9 illustrates a stage of a high-k/metal gate manufacturing process to manufacture the flash memory cell 402 and/or the flash memory cell 404 of FIG. 3 of FIG. 4. FIG. 10 illustrates a stage of a high-k/metal gate manufacturing process to manufacture the flash memory cell 502 and/or the flash memory cell 504 of FIG. 5. FIG. 11 illustrates a stage of a high-k/metal gate manufacturing process to manufacture the flash memory cell 602 and/or the flash memory cell 604 of FIG. 6.

FIG. 7 illustrates a particular embodiment of stages of a process 700 to manufacture the flash memory cell 202 and/or the flash memory cell 204 of FIG. 2. For purpose of brevity, only the manufacturing process of the flash memory cell 202 is described with reference to FIG. 7. At a first processing stage 702, the well region 208 may be formed in the substrate 206 via dopant implantation. The bit line region 210, the connection region 212, and the source line region 214 may be formed in the well region 208 via dopant implantation. In a particular embodiment, the source line region 214 is a deep source region (e.g., a source layer that has a deeper depth than a standard logic source layer). The gate dielectric layer 220 may be formed (e.g., via a deposition process or a growth process) on a surface on the well region 208. The gate dielectric layer 220 may include oxide or material with a high dielectric constant ("high-k"). Dummy poly-silicon gates 708 and 710 may be formed on a surface of the gate dielectric layer 220 via a deposition process and a patterning process.

At a second processing stage 704, the spacer layers 222, 240, 244, and 248 may be formed adjacent to sidewalls of the dummy poly-silicon gates 708 and 710. For example, the spacer layers 244 and 248 may be formed adjacent to the sidewalls of the dummy poly-silicon gate 708 and the spacer layers 222 and 240 may be formed adjacent to the sidewalls of the dummy poly-silicon gate 710.

A first interlayer dielectric (ILD) oxide layer 712 may be formed (e.g., via a deposition process). In a particular embodiment, a stress film layer (not shown in FIG. 7) is deposited on surfaces of the spacer layers 222, 240, 244, and 248, surfaces of the word lines 216 and the floating gate 218, and the surface of the well region 208. The stress film layer may be a silicon nitride film layer.

After the first ILD oxide layer 712 is formed, the dummy poly-silicon gates 708 and 710 may be removed via etching and high-k dielectric and the word line 216 and the floating gate 218 may be formed (e.g., via a metal gate film deposition process) in place of the removed dummy poly-silicon gates 708 and 710. The bit line terminal 232 and the erase contact terminal 234 may be formed, such as via an etching process, a deposition process, and a patterning process and a chemical-mechanical polishing (CMP) process. The bit line terminal 232 may be coupled to the bit line region 210 and the erase contact terminal 234 may be coupled to a surface of the source line region 214. The bit line terminal 232 and the erase contact terminal 234 may be formed using metal, such as tungsten, copper, aluminum, etc.

At a third processing stage 706, the capacitive film layer 250 may be formed via a deposition process. The capacitive film layer 250 may be coupled to the floating gate 218. For example, the capacitive film layer 250 may be deposited on a surface of the ILD oxide layer 712 so that the capacitive film layer 250 is in contact with the surface of the floating gate 218. The capacitive film layer 250 may include silicon carbide, silicon nitride, silicon dioxide-silicon nitride, silicon dioxide-silicon carbide, silicon dioxide-aluminum oxide, silicon dioxide-silicon nitride-silicon dioxide, silicon dioxide-hafnium oxide-silicon dioxide, silicon dioxide-aluminum oxide-silicon dioxide, etc.

The control gate 224 may be formed via a high resistance metal film deposition process. The control gate 224 may be formed using a type of high resistance metal, such as tantalum nitride, titanium nitride, etc. The control gate 224 may be coupled to the floating gate 218 via the capacitive film layer 250. After the control gate 224 is formed, a second ILD oxide layer 714 may be formed via a deposition process and oxide CMP process and regions of the capacitive film layer 250 that are in contact with the bit line terminal 232, the word line 216, and the erase contact terminal 234 may be removed via an etching process. The first metal layer 226 may be formed in regions of the second ILD oxide layer 714 via a patterning process, an etching process, and a deposition process and a CMP process. Additional layers, such as the via layer 228 (not shown in FIG. 7) and the second metal layer 230 (not shown in FIG. 7) may also be formed.

A thickness of the capacitive film layer 250 may be tuned to enhance/improve data retention performance and endurance of the flash memory cell 202. To further improve the data retention performance, error-correction code (ECC) circuits or auto repair circuits or period refresh may be implemented as part of the flash memory cell 202. Further, by adjusting the thickness of the capacitive film layer 250, a programming voltage of the flash memory cell 202 may also be enhanced/improved.

FIG. 8 illustrates a particular embodiment of a processing stage 800 of a process to manufacture the flash memory cell 302 and/or the flash memory cell 304 of FIG. 3. At the processing stage 800, after the control gate 224 is formed. The second ILD oxide layer 714 may be formed via a deposition process. The first metal layer 226 and the metal erase gate 306 may be formed by patterning appropriate regions of the second ILD oxide layer 714 and depositing a layer of metal film, such as tungsten, copper, aluminum, etc. into the patterned regions. The metal erase gate 306 may be adjacent to the spacer layer 240. Additional layers, such as the via layer 228 (not shown in FIG. 8) and the second metal layer 230 (not shown in FIG. 8) may also be formed.

FIG. 9 illustrates a particular embodiment of a processing stage 900 of a process to manufacture the flash memory cell 402 and/or the flash memory cell 404 of FIG. 4. At the processing stage 900, after the second ILD oxide layer 714 is formed, regions of the second ILD oxide layer 714, the capacitive film layer 250, and the first ILD oxide layer 712 may be patterned and etched to form a trench for the metal erase gate 406. The oxide layer 408 may be deposited onto inner surfaces of the trench. To reduce an erase voltage of the flash memory cell 402, a thickness of the oxide layer 408 may be adjusted during manufacturing. After depositing the oxide layer 408, the metal erase gate 406 may be deposited onto inner surfaces of the oxide layer 408. The metal erase gate 406 may be formed using the same metal film layer as the first metal layer 226. Additional layers, such as the via layer 228 (not shown in FIG. 9) and the second metal layer 230 (not shown in FIG. 9) may also be formed.

FIG. 10 illustrates a particular embodiment of a processing stage 1000 of a process to manufacture the flash memory cell 502 and/or the flash memory cell 504 of FIG. 5. At the processing stage 1000, the spacer layer 510 may be trimmed via an etching process so that at least a region of the side wall 238 is exposed (e.g., not surrounded by the spacer layer 510) and the spacer layer 510 has a smaller thickness as compared to the spacer layer 222.

The first ILD oxide layer 712 may be formed via a deposition process after trimming the spacer layer 510. Regions of the first ILD oxide layer 712 may be patterned and etched to form a trench for the metal erase gate 506. The oxide layer 508 may be deposited onto inner surfaces of the trench. Regions of the oxide layer 508 may be in contact with the exposed region of the side wall 238. To reduce an erase voltage of the flash memory cell 502, a thickness of the oxide layer 508 may be adjusted during manufacturing. After depositing the oxide layer 508, the metal erase gate 506 may be deposited onto inner surfaces of the oxide layer 508. The metal erase gate 506 may be formed using the same metal film layer as the bit line terminal 232. Additional layers, such as the control gate 224 (not shown in FIG. 10), the via layer 228 (not shown in FIG. 10), etc., may also be formed.

FIG. 11 illustrates a particular embodiment of a processing stage 1100 of a process to manufacture the flash memory cell 602 and/or the flash memory cell 604 of FIG. 6. At the processing stage 1100, a spacer layer (not shown in FIG. 11) that surrounds the side wall 238 may be removed via etching. After removing the spacer layer, the first ILD oxide layer 712 may be formed via a deposition process. A region of the first ILD oxide layer 712 may be patterned and etched to form a trench. The oxide layer 608 may be deposited onto inner surfaces of the trench. A region of the oxide layer 608 may be in contact with the side wall 238. To reduce an erase voltage of the flash memory cell 602, a thickness of the oxide layer 608 may be adjusted during manufacturing. After depositing the oxide layer 608, the metal erase gate 606 may be deposited onto inner surfaces of the oxide layer 608. The metal erase gate 606 may be formed using the same metal film layer as the bit line terminal 232. Additional layers, such as the control gate 224 (not shown in FIG. 11), the via layer 228 (not shown in FIG. 11), etc., may also be formed.

Figure 12:
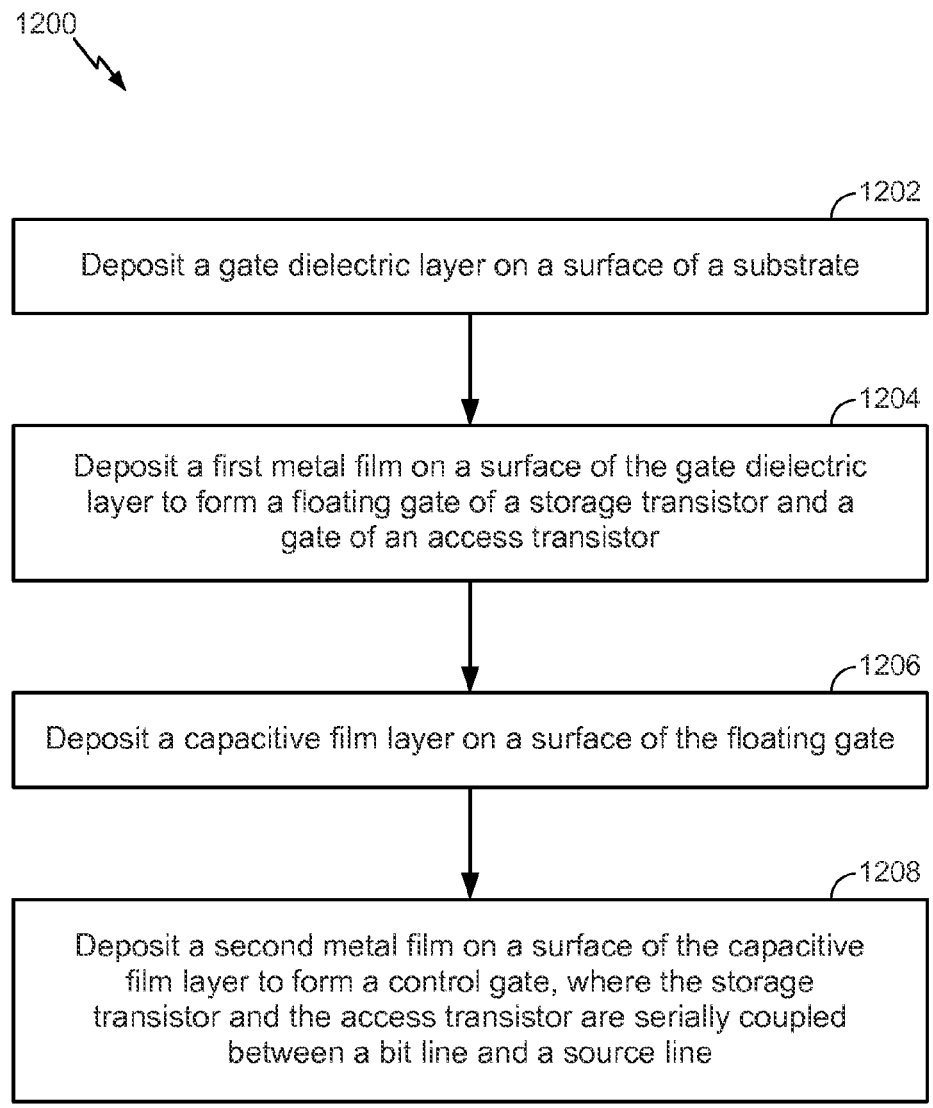
FIG. 12 is a flowchart that illustrates another particular embodiment of a method of manufacturing a flash memory cell using a high-k/metal gate manufacturing process.

FIG. 12 is a flowchart that illustrates a particular embodiment of a method 1200 of manufacturing a flash memory cell using a high-k/metal gate manufacturing process. The method 1200 includes depositing a gate dielectric layer on a surface of a substrate, at 1202. For example, referring to FIG. 7, the gate dielectric layer 220 may be formed (e.g., via a deposition process or a growth process) on the surface on the well region 208. A first metal film is deposited on a surface of the gate dielectric layer to form a floating gate of a storage transistor and a gate of an access transistor, at 1204. For example, referring to FIG. 7, the floating gate 218 may be formed (e.g., via a metal gate film deposition process) in place of the removed dummy poly-silicon gates 708 and 710. The word line 216 that corresponds to the gate 144 of the access transistor 130 in FIG. 1 may also be formed via a metal gate film deposition process.

A capacitive film layer is deposited on a surface of the floating gate, at 1206. For example, referring to FIG. 7, the capacitive film layer 250 may be deposited on a surface of the ILD oxide layer 712 so that the capacitive film layer 250 is in contact with the surface of the floating gate 218. A second metal film is deposited on a surface of the capacitive film layer to form a control gate, where the storage transistor and the access transistor are serially coupled between a bit line and a source line, such as the storage transistor 190 including the floating gate 106 and the access transistor 192 including the word line 114 coupled between the source line region 116 and the bit line 120 of FIG. 1, at 1208. For example, referring to FIG. 7, the control gate 224 may be formed via a metal film deposition process. Thus, the method 1200 may enable a flash memory cell to be manufactured using a high-k/metal gate manufacturing process. The high-k/metal gate manufacturing process may enable tuning of capacitive coupling between a floating gate and a metal control gate, thus a programming voltage of the flash memory cell may be reduced.

Figure 13:
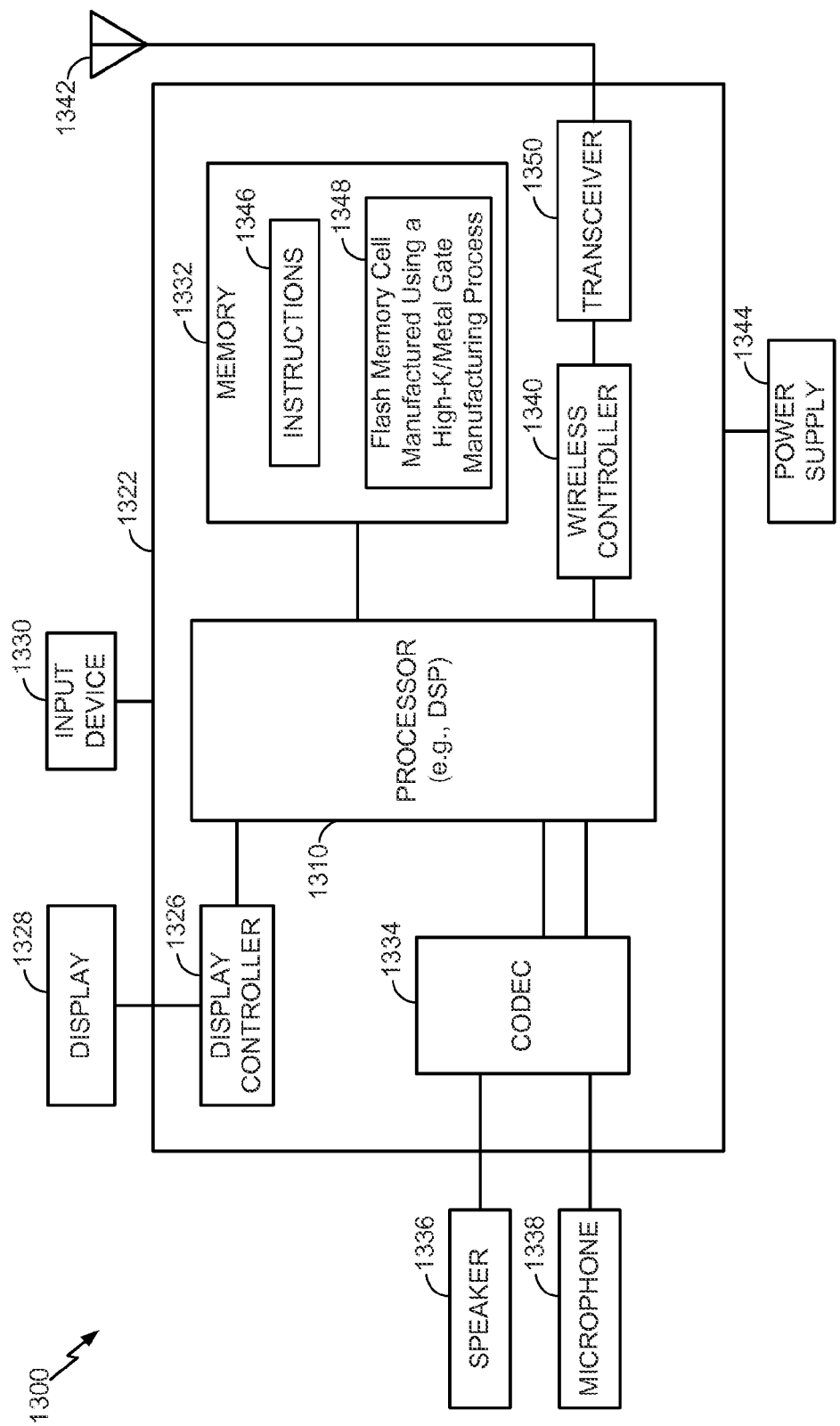
FIG. 13 is a diagram of a particular embodiment of a communication device that includes a flash memory cell manufactured using a high-k/metal gate manufacturing process.

FIG. 13 is a block diagram of a communication device 1300 that includes a flash memory cell (e.g., any of the flash memory cells in FIGS. 1-6). The methods described in FIGS. 7-12, or certain portions thereof, may be used to manufacture components of the communication device 1300.

The communication device 1300 includes a processor 1310, such as a digital signal processor (DSP), coupled to a memory 1332. The memory 1332 may be a non-transitory tangible computer-readable and/or processor-readable storage device that stores instructions 1346. The instructions 1346 may be executable by the processor 1310. The memory 1332 may be implemented at least in part using flash memory cells, such as a flash memory cell 1348. The flash memory cell 1348 may be any of the flash memory cells in FIGS. 1-6.

FIG. 13 shows that the communication device 1300 may also include a display controller 1326 that is coupled to the processor 1310 and to a display device 1328. A coder/decoder (CODEC) 1334 can also be coupled to the processor 1310. A speaker 1336 and a microphone 1338 can be coupled to the CODEC 1334. FIG. 13 also shows a wireless controller 1340 coupled to the processor 1310. The wireless controller 1340 is in communication with an antenna 1342 via a transceiver 1350. The wireless controller 1340, the transceiver 1350, and the antenna 1342 may represent a wireless interface that enables wireless communication by the communication device 1300. The communication device 1300 may include numerous wireless interfaces, where different wireless networks are configured to support different networking technologies or combinations of networking technologies (e.g., Bluetooth low energy. Near-field communication, Wi-Fi, cellular, etc.).

In a particular embodiment, the processor 1310, the display controller 1326, the memory 1332, the CODEC 1334, the wireless controller 1340, and the transceiver 1350 are included in a system-in-package or system-on-chip device 1322. In a particular embodiment, an input device 1330 and a power supply 1344 are coupled to the system-on-chip device 1322. Moreover, in a particular embodiment, as illustrated in FIG. 13, the display device 1328, the input device 1330, the speaker 1336, the microphone 1338, the antenna 1342, and the power supply 1344 are external to the system-on-chip device 1322. However, each of the display device 1328, the input device 1330, the speaker 1336, the microphone 1338, the antenna 1342, and the power supply 1344 can be coupled to a component of the system-on-chip device 1322, such as an interface or a controller.

In conjunction with the described embodiments, an apparatus may include means for controlling a first conductive channel. The means for controlling the first conductive channel may include means for storing electrical charge and means for providing a voltage bias to the means for storing via capacitive coupling. For example, the means for storing may include the floating gate 106 of FIG. 1, the storage transistor 128, the first plate 134 of the plate capacitor 136, the floating gate 218 of FIGS. 2-11, one or more components (e.g., a metal floating gate) of the flash memory cell 1348 of FIG. 13, one or more other metal devices configured to store electrical charge, or a combination thereof. The means for providing a voltage bias may include the control gate 108 of FIG. 1, the second plate 138 of the plate capacitor 136, the control gate 224 of FIGS. 2-11, one or more components (e.g., a metal control gate) of the flash memory cell 1348 of FIG. 13, one or more other metal devices configured to provide a voltage bias, or a combination thereof.

The apparatus may also include means for controlling a second conductive channel. The means for controlling the second conductive channel may be coupled to the means for controlling the first conductive channel, and the means for controlling the first conductive channel and the means for controlling the second conductive channel may be serially coupled between a bit line and a source line. For example, the means for controlling the second conductive channel may include the word line 114 of FIG. 1, the word line 144, the access transistor 130, or the word line 216 of FIGS. 2-11, one or more components (e.g., a word line, an access transistor, etc.) of the flash memory cell 1348 of FIG. 13, one or more other devices configured to control a conductive channel, or a combination thereof.

Figure 14:
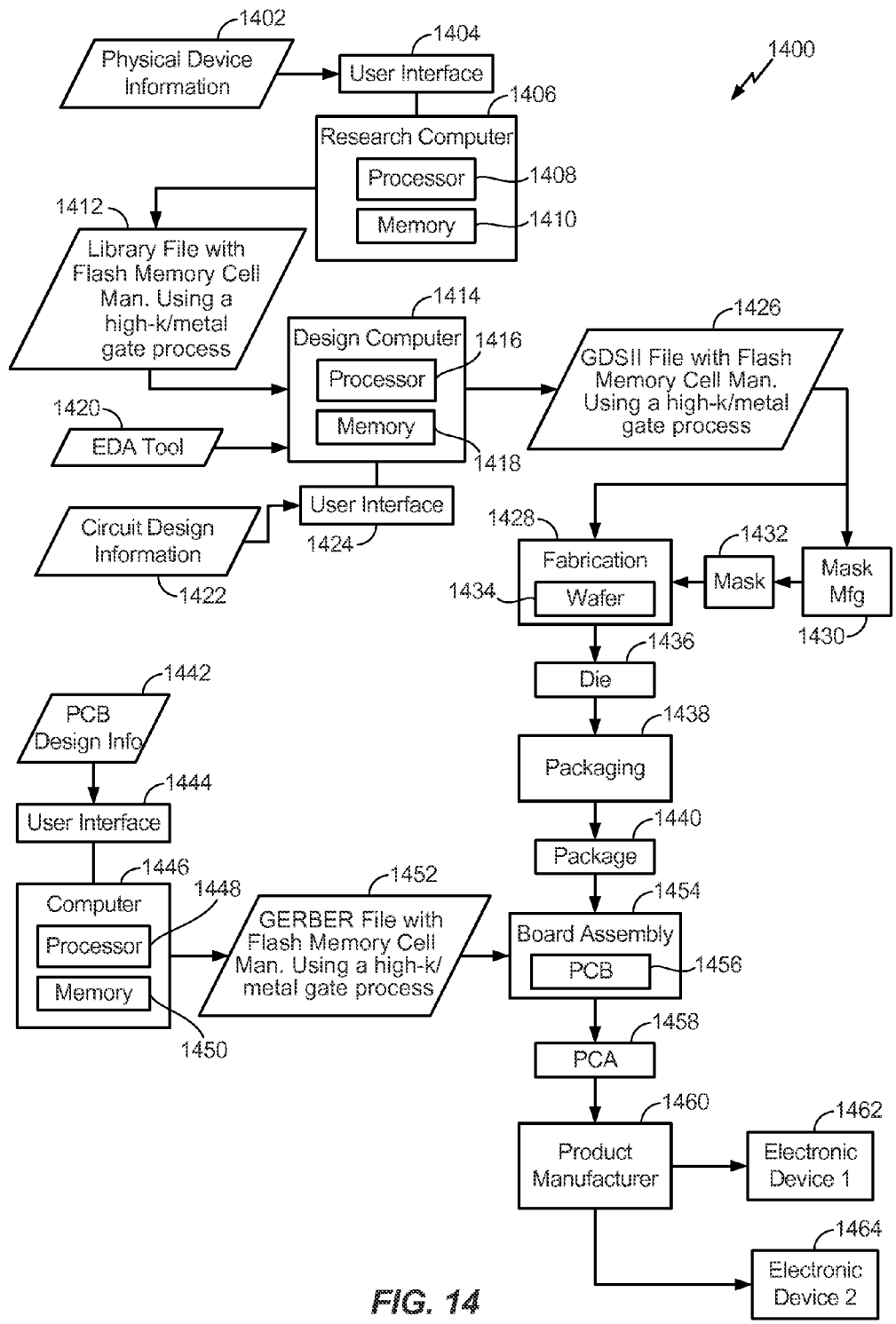
FIG. 14 is a data flow diagram that illustrates a particular embodiment of a process to manufacture a flash memory cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 14 depicts a particular illustrative embodiment of an electronic device manufacturing process 1400.

Physical device information 1402 is received at the manufacturing process 1400, such as at a research computer 1406. The physical device information 1402 may include design information representing at least one physical property of a semiconductor device, such as the flash memory cell 102 of FIG. 1, the flash memory cell circuit 126, any of the flash memory cells in FIGS. 2-11, the flash memory cell 1348 of FIG. 13, or a combination thereof. For example, the physical device information 1402 may include physical parameters, material characteristics, and structure information that is entered via a user interface 1404 coupled to the research computer 1406. The research computer 1406 includes a processor 1408, such as one or more processing cores, coupled to a computer readable medium such as a memory 1410. The memory 1410 may store computer readable instructions that are executable to cause the processor 1408 to transform the physical device information 1402 to comply with a file format and to generate a library file 1412.

In a particular embodiment, the library file 1412 includes at least one data file including the transformed design information. For example, the library file 1412 may include a library of semiconductor devices including a device that includes the flash memory cell 102 of FIG. 1, the flash memory cell circuit 126, any of the flash memory cells in FIGS. 2-11, the flash memory cell 1348 of FIG. 13, or a combination thereof. The library of semiconductor devices is provided for use with an electronic design automation (EDA) tool 1420.

The library file 1412 may be used in conjunction with the EDA tool 1420 at a design computer 1414 including a processor 1416, such as one or more processing cores, coupled to a memory 1418. The EDA tool 1420 may be stored as processor executable instructions at the memory 1418 to enable a user of the design computer 1414 to design a circuit including the flash memory cell 102 of FIG. 1, the flash memory cell circuit 126, any of the flash memory cells in FIGS. 2-11, the flash memory cell 1348 of FIG. 13, or a combination thereof of the library file 1412. For example, a user of the design computer 1414 may enter circuit design information 1422 via a user interface 1424 coupled to the design computer 1414. The circuit design information 1422 may include design information representing at least one physical property of a semiconductor device, such as the flash memory cell 102 of FIG. 1, the flash memory cell circuit 126, any of the flash memory cells in FIGS. 2-11, the flash memory cell 1348 of FIG. 13, or a combination thereof. To illustrate, the circuit design property may include identification of particular circuits and relationships to other elements in a circuit design, positioning information, feature size information, interconnection information, or other information representing a physical property of a semiconductor device.

The design computer 1414 may be configured to transform the design information, including the circuit design information 1422, to comply with a file format. To illustrate, the file formation may include a database binary file format representing planar geometric shapes, text labels, and other information about a circuit layout in a hierarchical format, such as a Graphic Data System (GDSII) file format. The design computer 1414 may be configured to generate a data file including the transformed design information, such as a GDSII file 1426 that includes information describing the flash memory cell 102 of FIG. 1, the flash memory cell circuit 126, any of the flash memory cells in FIGS. 2-11, the flash memory cell 1348 of FIG. 13, or a combination thereof, in addition to other circuits or information. To illustrate, the data file may include information corresponding to a system-on-chip (SOC) that includes the flash memory cell 102 of FIG. 1, the flash memory cell circuit 126, any of the flash memory cells in FIGS. 2-11, the flash memory cell 1348 of FIG. 13, or a combination thereof, and that also includes additional electronic circuits and components within the system-on-chip.

The GDSII file 1426 may be received at a fabrication process 1428 to manufacture the flash memory cell 102 of FIG. 1, the flash memory cell circuit 126, any of the flash memory cells in FIGS. 2-11, the flash memory cell 1348 of FIG. 13, or a combination thereof, using transformed information in the GDSII file 1426. For example, a device manufacture process may include providing the GDSII file 1426 to a mask manufacturer 1430 to create one or more masks, such as masks to be used with photolithography processing, illustrated as a representative mask 1432. The representative mask 1432 may be used during the fabrication process to generate one or more wafers 1434, which may be tested and separated into dies, such as a representative die 1436. The representative die 1436 includes a circuit including a device that includes the flash memory cell 102 of FIG. 1, the flash memory cell circuit 126, any of the flash memory cells in FIGS. 2-11, the flash memory cell 1348 of FIG. 13, or a combination thereof.

The representative die 1436 may be provided to a packaging process 1438 where the representative die 1436 is incorporated into a representative package 1440. For example, the package 1440 may include the die 1436 or multiple dies, such as a system-in-package (SiP) arrangement. The package 1440 may be configured to conform to one or more standards or specifications, such as Joint Electron Device Engineering Council (JEDEC) standards.

Information regarding the package 1440 may be distributed to various product designers, such as via a component library stored at a computer 1446. The computer 1446 may include a processor 1448, such as one or more processing cores, coupled to a memory 1450. A printed circuit board (PCB) tool may be stored as processor executable instructions at the memory 1450 to process PCB design information 1442 received from a user of the computer 1446 via a user interface 1444. The PCB design information 1442 may include physical positioning information of a packaged semiconductor device on a circuit board, the packaged semiconductor device corresponding to the package 1440 including the flash memory cell 102 of FIG. 1, the flash memory cell circuit 126, any of the flash memory cells in FIGS. 2-11, the flash memory cell 1348 of FIG. 13, or a combination thereof.

The computer 1446 may be configured to transform the PCB design information 1442 to generate a data file, such as a GERBER file 1452 with data that includes physical positioning information of a packaged semiconductor device on a circuit board, as well as layout of electrical connections such as traces and vias, where the packaged semiconductor device corresponds to the package 1440 includes the flash memory cell 102 of FIG. 1, the flash memory cell circuit 126, any of the flash memory cells in FIGS. 2-11, the flash memory cell 1348 of FIG. 13, or a combination thereof. In other embodiments, the data file generated by the transformed PCB design information may have a format other than a GERBER format.

The GERBER file 1452 may be received at a board assembly process 1454 and used to create PCBs, such as a representative PCB 1456, manufactured in accordance with the design information stored within the GERBER file 1452. For example, the GERBER file 1452 may be uploaded to one or more machines to perform various steps of a PCB production process. The PCB 1456 may be populated with electronic components including the package 1440 to form a representative printed circuit assembly (PCA) 1458.

The PCA 1458 may be received at a product manufacture process 1460 and integrated into one or more electronic devices, such as a first representative electronic device 1462 and a second representative electronic device 1464. As an illustrative, non-limiting example, one or more of the electronic devices 1462 and 1464 may be remote units such as mobile phones, smart phones, tablet computers, laptop computers, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. As another illustrative, non-limiting example, the first representative electronic device 1462, the second representative electronic device 1464, or both, may be selected from the group of a set top box, a music player, a video player, an entertainment unit, a navigation device, a communications device, a personal digital assistant (PDA), a fixed location data unit, and a computer, into which the flash memory cell 102 of FIG. 1, the flash memory cell circuit 126, any of the flash memory cells in FIGS. 2-11, the flash memory cell 1348 of FIG. 13, or a combination thereof is integrated. Although FIG. 14 illustrates remote units using teachings of the disclosure, the disclosure is not limited to these illustrated units. Embodiments of the disclosure may be suitably employed in any device which includes active integrated circuitry including memory and on-chip circuitry.

A device that includes the flash memory cell 102 of FIG. 1, the flash memory cell circuit 126, any of the flash memory cells in FIGS. 2-11, the flash memory cell 1348 of FIG. 13, or a combination thereof may be fabricated, processed, and incorporated into an electronic device, as described in the illustrative process 1400. One or more aspects of the embodiments disclosed with respect to FIGS. 1-13 may be included or used at various processing stages, such as within the library file 1412, the GDSII file 1426, and the GERBER file 1452, as well as stored at the memory 1410 of the research computer 1406, the memory 1418 of the design computer 1414, the memory 1450 of the computer 1446, the memory of one or more other computers or processors (not shown) used at the various stages, such as at the board assembly process 1454, and also incorporated into one or more other physical embodiments such as the representative mask 1432, the representative die 1436, the package 1440, the PCA 1458, other products such as prototype circuits or devices (not shown), or any combination thereof. Although various representative stages of production from a physical device design to a final product are depicted, in other embodiments fewer stages may be used or additional stages may be included. Similarly, the illustrative process 1400 may be performed by a single entity or by one or more entities performing various stages of the illustrative process 1400.

During the fabrication process 1428, one or more storage devices (e.g., a computer readable memory) may include instructions executable by one or more computers to perform or initiate operations that include depositing a gate dielectric layer on a surface of a substrate. The operations may also include depositing a first metal gate film on a surface of the gate dielectric layer to form a floating gate of a storage transistor and a gate of an access transistor. The operations may further include depositing a capacitive film layer on a surface of the floating gate. The operations may further include depositing a second metal gate film on a surface of the capacitive film layer to form a control gate. The storage transistor and the access transistor are serially coupled between a bit line and a source line. The operations may be initiated at a processor integrated into an electronic device. In a particular embodiment, the operations are initiated by a processor that is integrated in a device. The device may be a computer or an electronic device that includes a controller.

One or more of the disclosed embodiments, such as FIGS. 1-6 and 13, may be implemented in a system or an apparatus that includes a cellular phone, a smart phone, a tablet computer, a laptop computer, a computer, a portable digital video player, or a portable computer, a portable music player, a personal digital assistant (PDA), or a mobile location data unit. Additionally, the system or the apparatus may include a communications device, a fixed location data unit, a set top box, an entertainment unit, a navigation device, a monitor, a computer monitor, a television, a tuner, a radio, a satellite radio, a music player, a digital music player, a video player, a digital video player, a digital video disc (DVD) player, a desktop computer, any other device that stores or retrieves data or computer instructions, or a combination thereof. As another illustrative, non-limiting example, the system or the apparatus may include remote units, such as global positioning system (GPS) enabled devices, navigation devices, fixed location data units such as meter reading equipment, or any other electronic device.

One or more of the disclosed embodiments, such as those depicted in FIGS. 7-12 and 14, may be performed by a system or an apparatus that includes instructions executable by one or more computers to perform or initiate one or more operations disclosed in FIGS. 7-12. Although one or more of FIGS. 1-14 illustrate systems, apparatuses, and/or methods according to the teachings of the disclosure, the disclosure is not limited to these illustrated systems, apparatuses, and/or methods. One or more embodiments of the disclosure, such as those depicted in FIGS. 1-6 and 13, may be suitably employed in any device that includes circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps may have been described above generally in terms of their functionality. Whether such functionality is implemented as hardware or processor executable instructions depends upon the particular application and design constraints imposed on the overall system. Additionally, the various operations of methods described above (e.g., any operation illustrated in FIGS. 1-14) may be performed by any suitable means capable of performing the operations, such as various hardware and/or processor executable software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more computer executable instructions or code on a computer-readable medium or a computer-readable storage device. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. An apparatus comprising:
   a storage transistor, wherein the storage transistor comprises:
      a floating gate configured to store electrical charge;
      an erase gate coupled to the floating gate, wherein the erase gate is configured to provide an erase current path to reduce an amount of the electrical charge stored in the floating gate; and
      a control gate, wherein the floating gate is coupled to the control gate via capacitive coupling, and wherein the floating gate and the control gate are metal; and
   an access transistor coupled to the storage transistor, wherein a gate of the access transistor is coupled to a word line, and wherein the storage transistor and the access transistor are serially coupled between a bit line and a source line.

2. The apparatus of claim 1, wherein the floating gate corresponds to a first plate of a plate capacitor and the control gate corresponds to a second plate of the plate capacitor.

3. The apparatus of claim 2, wherein the plate capacitor is configured to be biased to a positive voltage or a negative voltage.

4. The apparatus of claim 1, further comprising a high dielectric constant layer between the floating gate and a substrate.

5. The apparatus of claim 1, wherein the erase gate is metal.

6. The apparatus of claim 1, wherein the storage transistor is fabricated using a high-k/metal gate process.

7. The apparatus of claim 1, wherein the floating gate is an N-type metal gate, and wherein the storage transistor is a P-type transistor.

8. The apparatus of claim 1, wherein the floating gate is a P-type metal gate, and wherein the storage transistor is a P-type transistor.

9. The apparatus of claim 1, wherein the floating gate is an N-type metal gate, and wherein the storage transistor is an N-type transistor.

10. The apparatus of claim 1, wherein the floating gate is a P-type metal gate, and wherein the storage transistor is an N-type transistor.

11. The apparatus of claim 1, wherein the storage transistor and the access transistor are integrated in at least one semiconductor die.

12. The apparatus of claim 1, further comprising a device selected from the group consisting of a communications device, a cell phone, a smart phone, a tablet computer, a laptop computer, a set top box, a music player, a video player, an entertainment unit, a navigation device, a personal digital assistant (PDA), a fixed location data unit, and a computer, into which the storage transistor and the access transistor are integrated.

13. A method comprising:
   depositing a gate dielectric layer on a surface of a substrate;
   depositing a first metal film on a surface of the gate dielectric layer to form a floating gate of a storage transistor and a gate of an access transistor;
   depositing a capacitive film layer on a surface of the floating gate; and
   depositing a second metal film on a surface of the capacitive film layer to form a control gate, wherein the storage transistor and the access transistor are serially coupled between a bit line and a source line.

14. The method of claim 13, further comprising:
   forming a deep source region in the substrate prior to depositing the gate dielectric layer; and
   forming an erase gate terminal that is coupled to the deep source region.

15. The method of claim 13, further comprising:
   removing a portion of the capacitive film layer to form an opening; and
   forming a metal erase gate in the opening.

16. The method of claim 13, further comprising:
   forming a spacer on a side of the floating gate;
   trimming a portion of the spacer to form an opening; and
   forming an erase gate, wherein the erase gate is coupled to the floating gate via a dielectric layer.

17. The method of claim 16, wherein the erase gate is configured to reduce an amount of electrical charge stored in the floating gate via the dielectric layer.

18. The method of claim 13, further comprising:
   forming a spacer on a first side of the floating gate; and
   forming an erase gate on a second side of the floating gate, wherein the erase gate is coupled to the floating gate via a dielectric layer.

19. The method of claim 13, wherein the floating gate is configured to:
   receive electrical charge via a first region of the floating gate; and
   discharge the electrical charge via a second region of the floating gate.

20. The method of claim 13, wherein the floating gate is an N-type metal gate, and wherein the floating gate is an element of a P-type transistor.

21. The method of claim 13, wherein the floating gate is a P-type metal gate, and wherein the floating gate is an element of a P-type transistor.

22. The method of claim 13, wherein the floating gate and the control gate are N-type metal gates, and wherein the floating gate is an element of an N-type transistor.

23. The method of claim 13, wherein the floating gate is a P-type metal gate, and wherein the floating gate is an element of an N-type transistor.

24. The method of claim 13, wherein depositing the gate dielectric layer, depositing the first metal film, depositing the capacitive film layer, and depositing the second metal film are initiated at a processor integrated into an electronic device.

25. An apparatus comprising:
   means for controlling a first conductive channel, wherein the means for controlling the first conductive channel comprises:
      means for storing electrical charge;
      means for erasure coupled to the means for storing electrical charge, wherein the means for erasure is configured to provide an erase current path to reduce an amount of the electrical charge stored in the means for storing electrical charge; and
      means for providing a voltage bias via capacitive coupling to the means for storing; and
   means for controlling a second conductive channel, wherein the means for controlling the second conductive channel is coupled to the means for controlling the first conductive channel, and wherein the means for controlling the first conductive channel and the means for controlling the second conductive channel are serially coupled between a bit line and a source line.

26. The apparatus of claim 25, wherein the means for controlling the first conductive channel and the means for controlling the second conductive channel are integrated in at least one semiconductor die.

27. The apparatus of claim 25, further comprising a device selected from the group consisting of a communications device, a cell phone, a smart phone, a tablet computer, a laptop computer, a set top box, a music player, a video player, an entertainment unit, a navigation device, a personal digital assistant (PDA), a fixed location data unit, and a computer.

28. A computer-readable storage device storing instructions that are executable by a processor to initiate operations comprising:
   depositing a gate dielectric layer on a surface of a substrate;
   depositing a first metal film on a surface of the gate dielectric layer to form a floating gate of a storage transistor and a gate of an access transistor;
   depositing a capacitive film layer on a surface of the floating gate; and
   depositing a second metal film on a surface of the capacitive film layer to form a control gate, wherein the storage transistor and the access transistor are serially coupled between a bit line and a source line.

29. The computer-readable storage device of claim 28, wherein the instructions are executable by a particular processor integrated in a device selected from the group consisting of a communications device, a cell phone, a smart phone, a tablet computer, a laptop computer, a set top box, a music player, a video player, an entertainment unit, a navigation device, a personal digital assistant (PDA), a fixed location data unit, and a computer.

30. A method comprising:
   a first step for depositing a gate dielectric layer on a surface of a substrate;
   a second step for depositing a first metal film on a surface of the gate dielectric layer to form a floating gate of a storage transistor and a gate of an access transistor;
   a third step for depositing a capacitive film layer on a surface of the floating gate; and
   a fourth step for depositing a second metal film on a surface of the capacitive film layer to form a control gate, wherein the storage transistor and the access transistor are serially coupled between a bit line and a source line.

31. The method of claim 30, wherein the first step, the second step, the third step, and the fourth step are performed by a processor integrated into an electronic device.

32. A method comprising:
   receiving design information comprising physical positioning information of a packaged semiconductor device on a circuit board, the packaged semiconductor device comprising:
      a storage transistor, wherein the storage transistor comprises:
         a floating gate configured to store electrical charge;
         an erase gate coupled to the floating gate, wherein the erase gate is configured to provide an erase current path to reduce an amount of the electrical charge stored in the floating gate; and
         a control gate, wherein the floating gate is coupled to the control gate via capacitive coupling, and wherein the floating gate and the control gate are metal gates; and
      an access transistor coupled to the storage transistor, wherein a gate of the access transistor is coupled to a word line, and wherein the storage transistor and the access transistor are serially coupled between a bit line and a source line; and
   transforming the design information to generate a data file.

33. The method of claim 32, wherein the data file has a GERBER format.

34. The method of claim 32, wherein the data file includes a GDSII format.

* * * * *